US009847701B2

United States Patent
Hayslett et al.

(10) Patent No.: US 9,847,701 B2
(45) Date of Patent: Dec. 19, 2017

(54) DETERMINATION OF ROTOR FATIGUE IN AN ELECTRIC MACHINE ASSEMBLY

(71) Applicant: GM GLOBAL TECHNOLOGY OPERATIONS LLC, Detroit, MI (US)

(72) Inventors: Steven L. Hayslett, Troy, MI (US); Chad A. Freitas, Metamora, MI (US); Matthew D. Laba, Oakland, MI (US)

(73) Assignee: GM Global Technology Operations LLC, Detroit, MI (US)

(*) Notice: Subject to any disclaimer, the term of this patent is extended or adjusted under 35 U.S.C. 154(b) by 163 days.

(21) Appl. No.: 14/955,666

(22) Filed: Dec. 1, 2015

(65) Prior Publication Data
US 2017/0155307 A1    Jun. 1, 2017

(51) Int. Cl.
*H02P 6/14*     (2016.01)
*H02K 11/21*    (2016.01)
*G01R 31/34*    (2006.01)
*H02P 29/02*    (2016.01)
*H02P 29/032*   (2016.01)

(52) U.S. Cl.
CPC ........... *H02K 11/21* (2016.01); *G01R 31/343* (2013.01); *H02P 29/02* (2013.01); *H02P 29/032* (2016.02)

(58) Field of Classification Search
CPC .......... H02K 11/21; G01R 31/343; H02P 6/14
USPC .................................................... 318/400.37
See application file for complete search history.

(56) References Cited

U.S. PATENT DOCUMENTS

| | | | | |
|---|---|---|---|---|
| 3,364,407 A * | 1/1968 | Hill | ........................ | H02K 29/08 318/400.26 |
| 3,446,224 A * | 5/1969 | Zwicky, Jr. | ............. | F01D 19/02 415/1 |
| 4,206,389 A * | 6/1980 | Snyder | .................... | H02P 7/298 318/432 |
| 4,589,255 A * | 5/1986 | Martens | ................ | F01D 17/085 60/646 |
| 4,626,751 A * | 12/1986 | Doemen | ................ | H02K 29/08 318/400.08 |
| 5,433,079 A * | 7/1995 | Badami | ................... | F01D 19/02 60/646 |
| 2004/0034483 A1* | 2/2004 | Sonnichsen | ......... | G01M 13/028 702/56 |

(Continued)

*Primary Examiner* — Kawing Chan
(74) *Attorney, Agent, or Firm* — Quinn IP Law

(57) ABSTRACT

An electric machine assembly includes an electric machine including a rotor. A controller operatively connected to the electric machine and configured to receive a torque command. The rotor is configured to rotate at a rotor speed ($\omega$) based at least partially on the torque command. The controller has a processor and tangible, non-transitory memory on which is recorded instructions for executing a method for determining a cumulative rotor fatigue ($F_C$) based at least partially on the rotor speed. The controller is operative to control at least one operating paramater of the electric machine based at least partially on the cumulative rotor fatigue ($F_C$). The controller is configured to record respective occurrences of the rotor stress value exceeding respective predefined stress levels in chronological order to create a cycle dataset, such that the cycle dataset preserves a time order of the respective occurrences.

13 Claims, 2 Drawing Sheets

(56) References Cited

U.S. PATENT DOCUMENTS

| | | | |
|---|---|---|---|
| 2008/0218119 A1* | 9/2008 | Cyran | H02P 6/34 318/806 |
| 2010/0123314 A1* | 5/2010 | Menke | F03D 7/0248 290/44 |
| 2011/0046897 A1* | 2/2011 | Blumenthal | F04D 19/042 702/34 |
| 2011/0213568 A1* | 9/2011 | Potdar | H02K 15/00 702/34 |
| 2013/0038259 A1* | 2/2013 | Andersen | H02P 1/029 318/400.28 |
| 2013/0134241 A1* | 5/2013 | Tso | B02C 18/0007 241/25 |
| 2014/0081583 A1* | 3/2014 | Kianpour | G06F 11/3409 702/34 |
| 2014/0193238 A1* | 7/2014 | Sheridan | F02C 7/36 415/1 |
| 2016/0102612 A1* | 4/2016 | Kaufman | F02C 3/34 60/39.49 |
| 2017/0124779 A1* | 5/2017 | Westendorf | G07C 5/085 |

* cited by examiner

DETERMINATION OF ROTOR FATIGUE IN AN ELECTRIC MACHINE ASSEMBLY

TECHNICAL FIELD

The disclosure relates generally to determination of fatigue for a rotor in an electric machine assembly.

BACKGROUND

An electric machine, such as an interior permanent magnet machine, includes a rotor having a plurality of permanent magnets of alternating polarity. The rotor is rotatable within a stator which generally includes multiple stator windings and magnetic poles of alternating polarity. In order to improve performance and efficiency, rotors may be rotated at higher speeds, however, this may increase stress on the rotor.

SUMMARY

An electric machine assembly includes an electric machine having a rotor. A controller is operatively connected to the electric machine and is configured or programmed to receive a torque command. The rotor is configured to rotate at a rotor speed ($\omega$) based at least partially on the torque command. The controller has a processor and tangible, non-transitory memory on which is recorded instructions for executing a method for determining a cumulative rotor fatigue ($F_C$) based at least partially on the rotor speed. The controller is operative to control at least one operating paramater of the electric machine based at least partially on the cumulative rotor fatigue ($F_C$).

A speed sensor may be operatively connected to the controller and configured to obtain the rotor speed. Execution of the instructions by the processor causes the controller to convert an absolute value of the rotor speed to a rotor stress value using predetermined look-up values. The controller is configured to record respective occurrences of the rotor stress value exceeding respective predefined stress levels in chronological order to create a cycle dataset, such that the cycle dataset preserves a time order of the respective occurrences.

The controller may be configured to convert the cycle dataset into a plurality of data points ($D_i$) each characterized by a respective stress range ($R_i$), a respective mean stress ($M_i$) and a respective number of events ($n_i$). The controller may be configured to determine if a last one of the plurality of data points ($D_i$) is zero. If the last one of the plurality of data points ($D_i$) is not zero, then the controller is configured to replace the last one of the plurality of data points ($D_i$) with a predefined maximum value.

The controller may be configured to obtain a respective fatigue value ($V_i$) for each of the plurality of data points ($D_i$) based at least partially on the respective stress range ($R_i$), the respective mean stress ($M_i$), the respective number of events ($n_i$), a first predefined constant (C1), a second predefined constant (C2), and a third predefined constant (C3). The respective fatigue value ($V_i$) is defined as a ratio of the respective number of events ($n_i$) and a first parameter ($N_i$), the first parameter ($N_i$) being defined as:

$$N_i = [C1 * R_i/(1-(C2*M_i))]^{C3}.$$

A cycle fatigue factor ($F_1$) is obtained as a summation ($F_1 = {}_i\Sigma V_i$) of the respective fatigue values ($V_i$) of each of the plurality of data points ($D_i$). The plurality of data points ($D_i$) represents a single one of a plurality of cycles. The controller is configured to obtain respective cycle fatigue factors ($F_1 \ldots F_n$) for each of the plurality of cycles. The controller is configured to obtain a cumulative rotor fatigue (CF) as a summation (CF=${}_n\Sigma F$) of the respective cycle fatigue factors ($F_1 \ldots F_n$).

The electric machine may include a stator having stator windings. A current-limiting device may be operatively connected to the controller and configured to selectively limit an electric current to the stator windings. The controller may be configured to determine if the cumulative rotor fatigue ($F_C$) is above a predefined fatigue threshold. If the cumulative rotor fatigue ($F_C$) is above the threshold, the controller is configured to change at least one parameter of the electric machine to limit the speed of the rotor, such as, for example enabling the current-limiting device.

The above features and advantages and other features and advantages of the present disclosure are readily apparent from the following detailed description of the best modes for carrying out the disclosure when taken in connection with the accompanying drawings.

DETAILED DESCRIPTION

Figure 1:
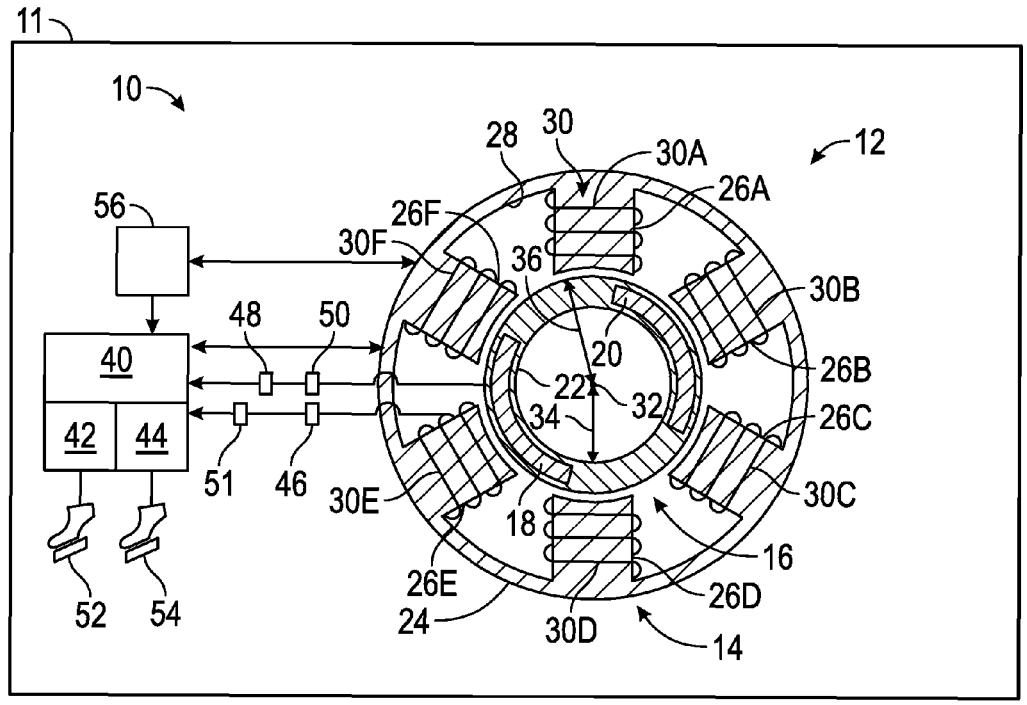
FIG. 1 is a schematic fragmentary partly-sectional view of an electric machine assembly with an electric machine having a rotor.

Referring to the drawings, wherein like reference numbers refer to like components, FIG. 1 schematically illustrates an electric machine assembly 10. The assembly 10 includes an electric machine 12. The assembly 10 may be a component of a device 11. The device 11 may be a transportation device with one or more wheels, such as a bicycle, passenger vehicle, performance vehicle, military vehicle or industrial vehicle. The device 11 may be a robot, farm implement, sports-related equipment or any other type of apparatus.

Referring to FIG. 1, the electric machine 12 includes a stator 14 and a rotor 16. The rotor 16 may include a first permanent magnet 18 and a second permanent magnet 20 of alternating polarity around the outer periphery of a rotor core 22. The rotor 16 may include any number of permanent magnets; for simplicity only two are shown. The rotor 16 is rotatable at a rotor speed ($\omega$) within the stator 14. While the embodiment shown in FIG. 1 illustrates a three-phase, single pole-pair (i.e. two pole) machine, it is understood that any number of phases or pole pairs may be employed. The electric machine 12 may take many different forms and include multiple and/or alternate components and facilities. While an example electric machine 12 is shown in the Figures, the components illustrated in the Figures are not intended to be limiting. Indeed, additional or alternative components and/or implementations may be used.

Referring to FIG. 1, the stator 14 includes a stator core 24 which may be cylindrically shaped with a hollow interior.

The stator core 24 may include a plurality of inwardly-protruding stator teeth 26A-F, separated by slots 28. In the embodiment shown in FIG. 1, stator windings 30A-F may be operatively connected to the stator core 24, such as for example, being coiled around the stator teeth 26A-F. The operation of the electric machine 10 depends on the interaction between multiple magnetic fields. In the embodiment shown, these magnetic fields result from current flowing in the stator windings 30A-F and from the permanent magnets 18, 20. The current in the stator windings 30A-F produce a rotating magnetic field which induces an electromotive force in the rotor 16, causing it to rotate about a central axis (through origin 32). The rotor core 22 defines an inner radius 34 and an outer radius 36.

Referring to FIG. 1, the assembly 10 includes a controller 40 operatively connected to or in electronic communication with the electric machine 12. Referring to FIG. 1, the controller 40 includes at least one processor 42 and at least one memory 44 (or any non-transitory, tangible computer readable storage medium) on which are recorded instructions for executing method 100, shown in FIG. 2, for determining a cumulative rotor fatigue ($F_C$). The memory 44 can store controller-executable instruction sets, and the processor 42 can execute the controller-executable instruction sets stored in the memory 44. The controller 40 is operative to control at least one operating paramater of the electric machine 12 based at least partially on the cumulative rotor fatigue ($F_C$).

The controller 40 of FIG. 1 is configured, i.e., specifically programmed to execute the steps of the method 100 (as discussed in detail below with respect to FIG. 2) and may receive inputs from various sensors. Referring to FIG. 1, the assembly 10 may include a speed sensor 50 in communication (e.g., electronic communication) with the controller 40 and capable of measuring the speed of the rotor 16. The assembly 10 may include a first temperature sensor 46 (such as a thermistor or thermocouple) in communication with the controller 40, as shown in FIG. 1. The first temperature sensor 46 is capable of measuring the temperature of the stator windings 30 and sending input signals to the controller 40. The first temperature sensor 46 may be installed or mounted on one of the stator windings 30. A second temperature sensor 48 may be in communication with the controller 40 and configured to measure the temperature of the rotor 16. A magnetic flux sensor 51 may be in communication with the controller 40 and configured to measure the magnetic flux emanating from the electric machine 12.

The controller 40 is configured to receive a torque command (T*). The torque command (T*) may be received by the controller 40 in response to an operator input or an automatically-fed input condition monitored by the controller 40. If the device 11 is a vehicle, the controller 40 may determine the torque command (T*) based on input signals from an operator through an accelerator pedal 52 and brake pedal 54, shown in FIG. 1. The rotor 16 is configured to rotate at a rotor speed based at least partially on the torque command (T*).

Figure 2:
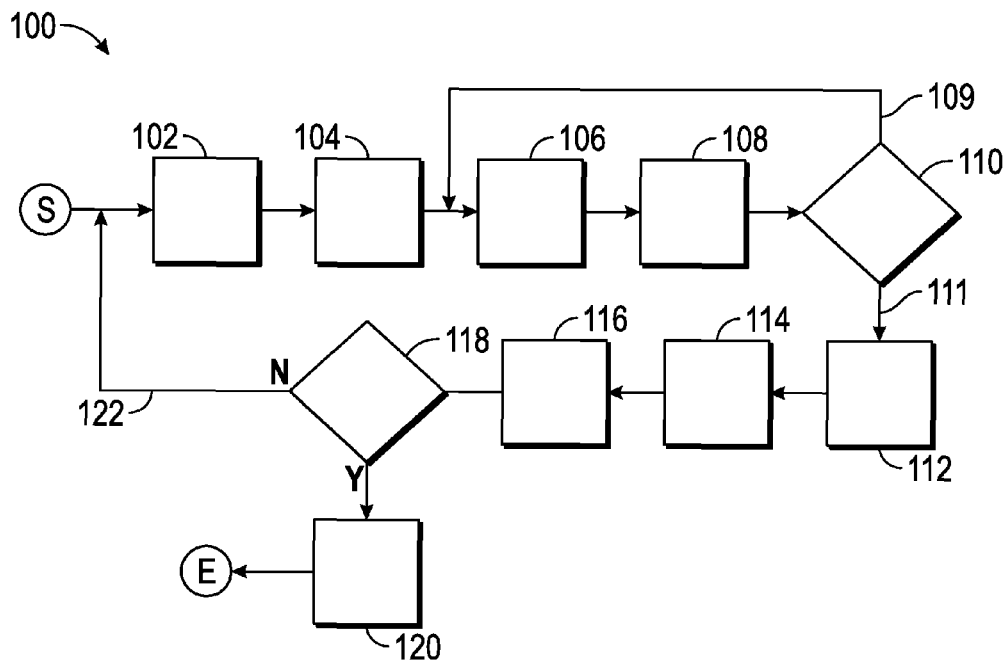
FIG. 2 is a flowchart for a method for determining fatigue for the rotor of FIG. 1.

Referring now to FIG. 2, a flowchart of the method 100 stored on and executable by the controller 40 of FIG. 1 is shown. Method 100 need not be applied in the specific order recited herein, for example, block 108 may be carried out before or after block 110. Furthermore, it is to be understood that some blocks may be eliminated. The start and end of the method 100 are indicated by "S" and "E", respectively. Referring to FIG. 2, method 100 may begin with block 102, where the controller 40 is programmed or configured to obtain the rotor speed. In one embodiment, the rotor speed is obtained via the speed sensor 50 of FIG. 1. Additionally, controller 40 may be programmed to determine the rotor speed based on other methods, without employing any sensors, such as finite element analysis (FEA) or any method or mechanism known to those skilled in the art.

Figure 3:
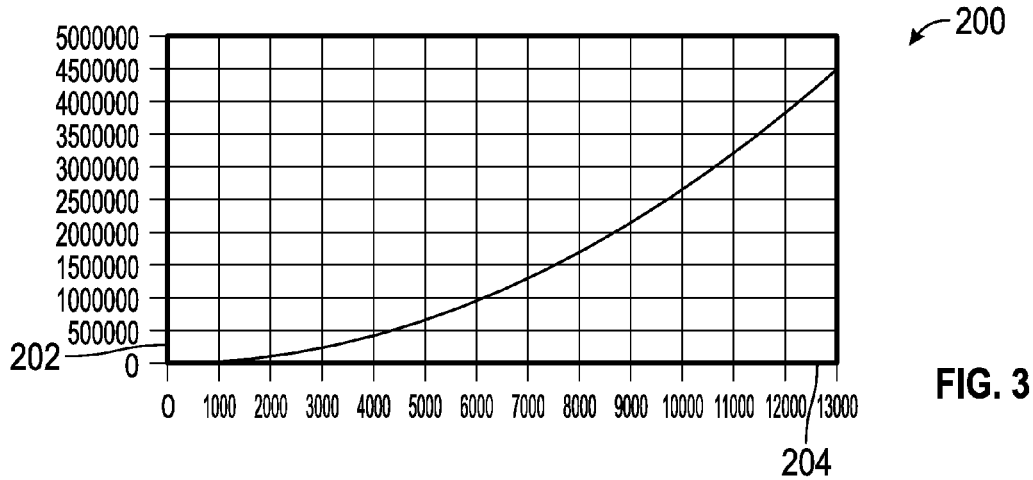
FIG. 3 is one example of a graph that may be employed in the method of FIG. 2, showing rotor stress values in the vertical axis and rotor speed in the horizontal axis.

In block 104 of FIG. 2, the controller 40 is configured to convert an absolute value of the rotor speed to a rotor stress value using predetermined look-up values. The predetermined look-up values may be from a look-up table, equations, a graph or a combination of these and other elements. Referring to FIG. 3, an example graph 200 for obtaining the look-up values is shown. In FIG. 3, the horizontal axis 204 represents the rotor speed (in rpm) and the vertical axis 202 represents the look-up values. To obtain the look-up values, characterization data may be taken in a test cell or laboratory at various rotor speeds at a baseline temperature. The look-up values may be obtained for a particular rotor 16 by employing finite element analysis and the physical properties of the materials within the rotor 16.

Figure 4:
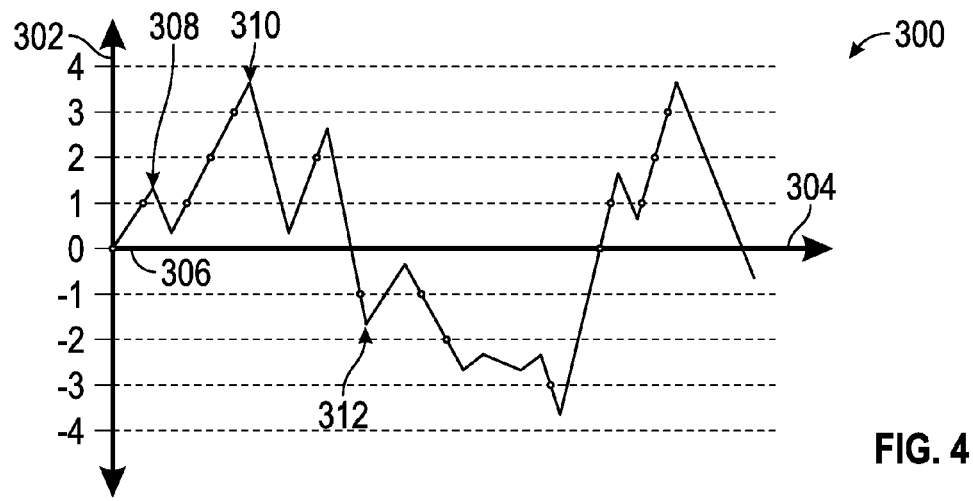
FIG. 4 is one example of a graph that may be employed in the method of FIG. 2, showing predefined speed thresholds in the vertical axis and time in the horizontal axis.

In block 106 of FIG. 2, the controller 40 is configured to record respective occurrences of the rotor stress value exceeding respective predefined stress levels in chronological order, in predefined bins, to create a cycle dataset, such that the cycle dataset preserves a time order of the respective occurrences. Referring to FIG. 4, an example graph 300 is presented, where the horizontal axis 304 represents time and the vertical axis 302 represents predefined stress levels (in megaPascals) offset from a reference stress level 306. For example, the occurrence corresponding to point 308 exceeds the 1 MegaPascal level (relative to the reference stress level 306) and is recorded in the bin corresponding to that level. The occurrence corresponding to point 310 exceeds each of the 1, 2 and 3 MegaPascal levels (relative to the reference stress level 306) and is recorded in each of those respective bins. Similarly, the occurrence corresponding to point 312 is recorded in the −1 MegaPascal (relative to the reference stress level 306) bin. The cycle dataset may be held in a queue with a FIFO (first-in-first-out) data structure. In a FIFO data structure, the first element added to the queue will be the first one to be removed. This is equivalent to the requirement that once a new point is added, all points that were added before have to be removed before the new point can be removed. The cycle dataset may be accumulated as FIFO compressed stress bins.

The controller 40 is configured to continue recording occurrences in the predefined bins until the assembly 10 is powered off (e.g., device 11 is keyed off) or the predefined bins are full for each cycle. The plurality of data points ($D_i$) may represent a single cycle, i.e., from power-on to power-off in the device 11.

In block 108 of FIG. 2, the controller 40 is configured to convert the cycle dataset into a plurality of data points ($D_i$) each characterized by a respective stress range ($R_i$), a respective mean stress ($M_i$) and a respective number of events ($n_i$). In one example, a rainflow counting method is used to convert the cycle dataset into the plurality of data points ($D_i$). As is known to those skilled in the art, the rainflow counting method reduces the time history to a sequence of tensile peaks and compressive valleys and counts the number of half cycles in the time history.

In block 110 of FIG. 2, the controller 40 is configured to determine if a last one of the plurality of data points ($D_i$) is zero. If the last one of the plurality of data points ($D_i$) is not zero, then the controller 40 is configured to replace the last one of the plurality of data points ($D_i$) with a predefined maximum value and proceed back to block 106, as indicated by line 109. The predefined maximum value may be set as the previous maximum stress value in the plurality of data points ($D_i$). If the last one of the plurality of data points ($D_i$) is zero (indicating that the cycle is complete), then the method 100 proceeds to block 112, as indicated by line 111.

Figure 5:
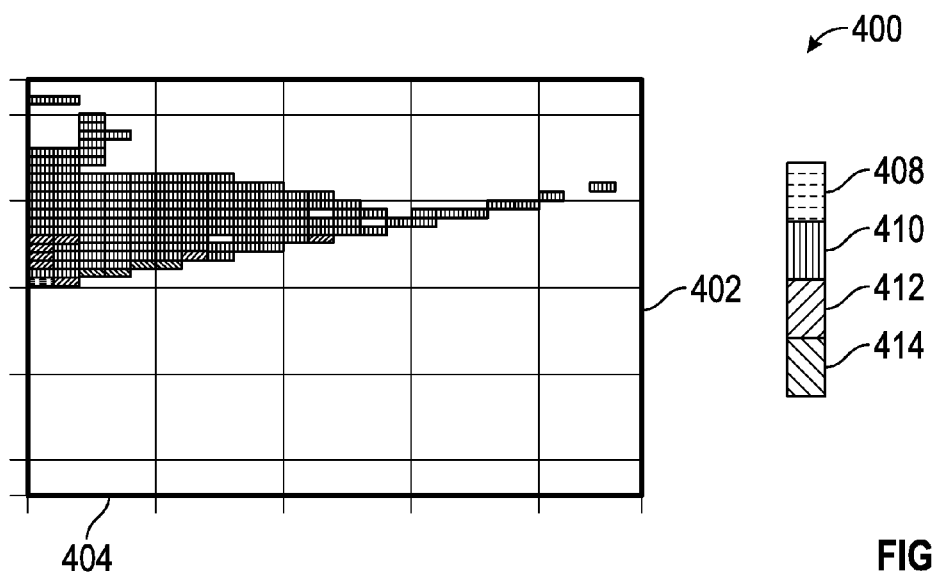
FIG. 5 is one example of a histogram that may be employed in the method of FIG. 2, showing stress range in the vertical axis and mean stress in the horizontal axis.

Referring to FIG. 5, an example histogram 400 displaying the plurality of data points ($D_i$) is presented. In FIG. 5, the horizontal axis 404 represents the mean stress ($M_i$) and the vertical axis 402 represents the stress range ($R_i$). The corresponding number of events ($n_i$) may be reflected with a plurality of legends, such as the first, second, third and fourth legends 408, 410, 412, 414 shown in FIG. 5. Each cycle may produce one histogram with numerous values of the stress range, mean stress and corresponding number of events (n). In one example, the first, second, third and fourth legends 408, 410, 412, 414 represent 1 million, 500 thousand, 300 thousand and 150 thousand occurrences, respectively. It is to be appreciated that graphs 200, 300 and 400 are presented as non-limiting examples.

In block 112 of FIG. 2, the controller 40 is configured to obtain a respective fatigue value ($V_i$) for each of the plurality of data points ($D_i$) based at least partially on the respective stress range ($R_i$), the respective mean stress ($M_i$), the respective number of events ($n_i$), a first predefined constant (C1), a second predefined constant (C2), and a third predefined constant (C3). The respective fatigue value ($V_i$) is defined as a ratio of the respective number of events ($n_i$) and a first parameter ($N_i$), the first parameter ($N_i$) being defined as:

$$N_i = \left(\frac{C1 * R}{[1 - (C2 * M)]}\right)^{C3}$$

The values of the first predefined constant (C1), second predefined constant (C2), and third predefined constant (C3) may be obtained empirically in a test cell or laboratory setting. The values may also be obtained through finite element analysis or any other method known to those skilled in the art. In one example, assuming the stress range and mean stress are in units of MPa or mega Pascal, the values of C1, C2, C3 are $7 \times 10^8$, $1.4 \times 10^9$, and $-8.3$, respectively.

In block 114 of FIG. 2, the controller 40 is configured to obtain a cycle fatigue factor ($F_1$) as a summation ($F_1 = {}_i\Sigma V_i$) of the respective fatigue values ($V_i$) of each of the plurality of data points ($D_i$), i.e., each point on the example histogram 400 in FIG. 5.

In block 116 of FIG. 2, the controller 40 is configured to obtain the cumulative rotor fatigue (CF) as a summation ($CF = {}_n\Sigma F$) of a plurality of cycles. The cycle fatigue factor ($F_1$) is one of a plurality of cycles ($F_1 \ldots F_n$). Thus, the plurality of data points ($D_i$) is used to obtain a current cycle fatigue which is added to subsequent (or prior) cycle fatigues to obtain a cumulative fatigue.

In block 118 of FIG. 2, the controller 40 is configured to determine if the cumulative rotor fatigue ($F_C$) is above a predefined fatigue threshold. If the cumulative rotor fatigue ($F_C$) is above the predefined fatigue threshold, the method 100 proceeds to block 120, where the controller 40 is configured to change at least one parameter of the electric machine 12 to limit the speed of the rotor 16, such as, for example activating or enabling a current-limiting device that allows only a maximum current to flow through the stator windings 30. This reduces stress on the rotor 16. Referring to FIG. 1, in the embodiment shown, the current-limiting device is a resistor 56. Any type of current-limiting device known to those skilled in the art may be employed. The resistor 56 may include a junction gate field-effect transistor (JFET) which allows a current passing through to increase to a maximum value and then level off. The JFET is a three-terminal semiconductor device that can be used as a voltage-controlled diode. The controller 40 may be configured to enable the resistor 56 through a switch (not shown) or any other device known to those skilled in the art.

If the cumulative rotor fatigue ($F_C$) is not above the predefined fatigue threshold, the method 100 loops to block 102, as indicated by line 122. As noted above, the controller 40 of FIG. 1 may include a computing device that employs an operating system or processor 42 and memory 44 for storing and executing computer-executable instructions. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor 42 (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. An electric machine assembly comprising:
an electric machine including a rotor;
a controller operatively connected to the electric machine and configured to receive a torque command;
wherein the rotor is configured to rotate at a rotor speed based at least partially on the torque command;
wherein the controller has a processor and tangible, non-transitory memory on which is recorded instructions for executing a method for determining a cumulative rotor fatigue (CF) based at least partially on the rotor speed, execution of the instructions by the processor causing the controller to:
convert an absolute value of the rotor speed to a rotor stress value using predetermined look-up values;
record respective occurrences of the rotor stress value exceeding respective predefined stress levels in chronological order to create a cycle dataset, such that the cycle dataset preserves a time order of the respective occurrences;
convert the cycle dataset into a plurality of data points ($D_i$) each characterized by a respective stress range ($R_i$), a respective mean stress ($M_i$) and a respective number of events ($n_i$);
determine if a last one of the plurality of data points ($D_i$) is zero;
if the last one of the plurality of data points ($D_i$) is not zero, then replace the last one of the plurality of data points ($D_i$) with a predefined maximum value; and
wherein the controller is operative to control at least one operating paramater of the electric machine based at least partially on the cumulative rotor fatigue (CF).

2. The assembly of claim 1, further comprising:
a speed sensor operatively connected to the controller and configured to obtain the rotor speed;
wherein the electric machine includes a stator having stator windings; and
a resistor operatively connected to the controller and configured to selectively limit an electric current to the stator windings.

3. The assembly of claim 1, wherein the controller is configured to:
obtain a respective fatigue value ($V_i$) for each of the plurality of data points ($D_i$) based at least partially on the respective stress range ($R_i$), the respective mean stress ($M_i$), the respective number of events ($n_i$), a first predefined constant (C1), a second predefined constant (C2), and a third predefined constant (C3).

4. The assembly of claim 3, wherein the respective fatigue value ($V_i$) is defined as a ratio of the respective number of events ($n_i$) and a first parameter ($N_i$), the first parameter ($N_i$) being defined as:

$$N_i = \left(\frac{C1*R}{[1-(C2*M)]}\right)^{C3}.$$

5. The assembly of claim 4, wherein the controller is configured to:
obtain a cycle fatigue factor ($F_1$) as a summation ($F_1 = \Sigma_i V_i$) of the respective fatigue values ($V_i$) of each of the plurality of data points ($D_i$), the plurality of data points ($D_i$) representing one of a plurality of cycles.

6. The assembly of claim 5, wherein:
the controller is configured to obtain respective cycle fatigue factors ($F_1 \ldots F_n$) for each of the plurality of cycles; and
the controller is configured to obtain a cumulative rotor fatigue (CF) as a summation (CF=$_n\Sigma F$) of the respective cycle fatigue factors factors ($F_1 \ldots F_n$).

7. The assembly of claim 6, wherein the electric machine includes a stator having stator windings and further comprising:
a current-limiting device operatively connected to the controller and configured to selectively limit a current flow to the stator windings;
wherein the controller is configured to determine if the cumulative rotor fatigue ($F_C$) is above a predefined fatigue threshold;
if the cumulative rotor fatigue (CF) is above the predefined fatigue threshold, then the controller being configured to enable the current-limiting device, thereby limiting the rotor speed.

8. A method for determining a cumulative rotor fatigue (CF) in an electric machine assembly having an electric machine with a rotor and a controller having a processor and tangible, non-transitory memory, the controller being configured to receive a torque command such that the rotor rotates at a rotor speed based at least partially on the torque command, the method comprising:
converting an absolute value of the rotor speed to a rotor stress value using predetermined look-up values, via the controller;
recording respective occurrences of the rotor stress value exceeding respective predefined stress levels in chronological order to create a cycle dataset, via the controller, such that the cycle dataset preserves a time order of the respective occurrences;
converting the cycle dataset, via the controller, into a plurality of data points ($D_i$) each characterized by a respective stress range ($R_i$), a respective mean stress ($M_i$) and a respective number of events ($n_i$);
determining if a last one of the plurality of data points ($D_i$) is zero, via the controller;
if the last one of the plurality of data points ($D_i$) is not zero, then replacing the last one of the plurality of data points ($D_i$) with a predefined maximum value, via the controller; and
controlling the electric machine based at least partially on the cumulative rotor fatigue (CF).

9. The method of claim 8, wherein the electric machine includes a stator having stator windings and further comprising:
a speed sensor operatively connected to the controller and configured to obtain the rotor speed; and
a current-limiting device operatively connected to the controller and configured to selectively limit an electric current to the stator windings.

10. The method of claim 8, further comprising:
obtaining a respective fatigue value ($V_i$), via the controller, for each of the plurality of data points ($D_i$) based at least partially on the respective stress range ($R_i$), the respective mean stress ($M_i$), the respective number of events ($n_i$), a first predefined constant (C1), a second predefined constant (C2), and a third predefined constant (C3).

11. The method of claim 10, wherein the respective fatigue value ($V_i$) is defined as a ratio of the respective number of events ($n_i$) and a first parameter ($N_i$), the first parameter ($N_i$) being defined as:

$$N_i = \left(\frac{C1 * R}{[1-(C2*M)]}\right)^{C3}.$$

12. The method of claim 11, further comprising:
obtaining a cycle fatigue factor ($F_1$) as a summation ($F_1 = {}_i\Sigma V_i$) of the respective fatigue values ($V_i$) of each of the plurality of data points ($D_i$), via the controller, the plurality of data points ($D_i$) representing one of a plurality of cycles;
obtaining respective cycle fatigue factors ($F_1 \ldots F_n$) for each of the plurality of cycles), via the controller; and
obtaining a cumulative rotor fatigue (CF), via the controller, as a summation (CF=${}_n\Sigma F$) of the respective cycle fatigue factors factors ($F_1 \ldots F_n$), via the controller.

13. The method of claim 12, wherein the electric machine includes a stator having stator windings and the assembly includes a current-limiting device, the method further comprising:
determining if the cumulative rotor fatigue ($F_C$) is above a predefined fatigue threshold, via the controller; and
if the cumulative rotor fatigue (CF) is above the predefined fatigue threshold, then limiting an electric current to the stator windings, via the current-limiting device.

\* \* \* \* \*